(12) United States Patent
Kubo et al.

(10) Patent No.: US 8,345,437 B2
(45) Date of Patent: Jan. 1, 2013

(54) CONNECTION STRUCTURE AND CONNECTION METHOD OF WIRING BOARD

(75) Inventors: Tomoyuki Kubo, Nagoya (JP); Yuji Shinkai, Handa (JP)

(73) Assignee: Brother Kogyo Kabushiki Kaisha, Aichi-ken (JP)

(*) Notice: Subject to any disclaimer, the term of this patent is extended or adjusted under 35 U.S.C. 154(b) by 93 days.

(21) Appl. No.: 13/073,666

(22) Filed: Mar. 28, 2011

(65) Prior Publication Data

US 2012/0067624 A1 Mar. 22, 2012

(30) Foreign Application Priority Data

Sep. 21, 2010 (JP) ................... 2010-210420

(51) Int. Cl.
*H05K 7/00* (2006.01)
(52) U.S. Cl. ........ 361/777; 174/259; 361/749; 361/760; 361/789; 361/792; 361/803; 439/67; 29/842
(58) Field of Classification Search .............. 174/250, 174/254, 257, 259, 261, 268; 361/749, 751, 361/760, 767, 777, 778, 784, 789, 790, 792, 361/803, 807–810; 439/65, 67, 70, 72; 29/842
See application file for complete search history.

(56) References Cited

U.S. PATENT DOCUMENTS

| | | | |
|---|---|---|---|
| 6,171,114 B1 * | 1/2001 | Gillette et al. ................. 439/67 |
| 7,168,960 B1 * | 1/2007 | Ju ................................. 439/67 |
| 7,484,967 B2 * | 2/2009 | Ichino et al. .................. 439/67 |
| 7,512,035 B2 * | 3/2009 | Sugahara ........................ 367/70 |
| 7,537,307 B2 * | 5/2009 | Sugahara ........................ 347/29 |
| 7,888,807 B2 * | 2/2011 | Sugahara ...................... 257/780 |
| 2005/0062807 A1 | 3/2005 | Ito et al. |
| 2006/0170738 A1 | 8/2006 | Kato |

FOREIGN PATENT DOCUMENTS

| | | |
|---|---|---|
| JP | 2005-197001 | 7/2005 |
| JP | 2005-254721 | 9/2005 |
| JP | 2006-231913 | 9/2006 |
| JP | 2006-346867 | 12/2006 |

* cited by examiner

*Primary Examiner* — Hoa C Nguyen
(74) *Attorney, Agent, or Firm* — Scully, Scott, Murphy & Presser, PC (57) ABSTRACT

A connection structure for connecting a wiring board to a to-be-connected body having electric contacts, the wiring board including: a base having board-side contacts provided on its facing surface that is to face the to-be-connected body; and a cover film which covers the facing surface except the board-side contacts and a non-covered partial region of the facing surface, the connection structure including: conduction portions formed of electrically conductive resin, for bonding the electric contacts and the board-side contacts to permit electrical conduction therebetween; and a reinforcement portion formed of the same resin as the conduction portions and disposed at a position which is different from positions of the conductive portions and at which the reinforcement portion extends across both of a surface of the cover film and a surface of the non-covered partial region of the base, the reinforcement portion bonding the to-be-connected body and the wiring board for reinforcing connection therebetween.

9 Claims, 10 Drawing Sheets

CONNECTION STRUCTURE AND CONNECTION METHOD OF WIRING BOARD

CROSS REFERENCE TO RELATED APPLICATION

The present application claims priority from Japanese Patent Application No. 2010-210420, which was filed on Sep. 21, 2010, the disclosure of which is herein incorporated by reference in its entirety.

BACKGROUND OF THE INVENTION

1. Field of the Invention

The present invention relates to a connection structure and a connection method of a wiring board.

2. Discussion of Related Art

There is known a connection structure in which a wiring board is connected to a to-be-connected body, such as an actuator and a sensor, having electric contacts. In the structure, there are conducted, via the wiring board, signal transmission/reception to/from the to-be-connected body, supplying of electric power to the to-be-connected body, and so on. As one example of the connection structure between the to-be-connected body and the wiring board, there is known a connection structure between an FPC (as the wiring board) and a piezoelectric actuator (as the to-be-connected body) of an ink-jet head. In the connection structure, the FPC and the piezoelectric actuator are electrically connected to each other by solders (each as a conduction portion) which are for bringing electric contacts of the piezoelectric actuator and electric contacts of the FPC into electrical conduction to one another. Further in the connection structure, there are provided, at positions different from the positions of the solders for electrical conduction, reinforcement solders (each as a reinforcement portion) by which the piezoelectric actuator and the FPC are mechanically connected.

In view of various reasons, there is disclosed a connection structure in which the to-be-connected-body and the wiring board are connected using a material other than the solders. For instance, there is known a structure for electrically and mechanically connecting a flexible print board and a plasma display panel in the following manner. Initially, electrically conductive resin including electrically conductive particles and a thermosetting insulating adhesive is applied between wiring terminals (as board-side contacts) of the flexible print board and electrodes (as electric contacts) of the plasma display panel as the to-be-connected body. Subsequently, the flexible print board is pressed, while being heated, onto the plasma display panel, whereby the electrically conductive resin is cured to allow electrical and mechanical connection of the flexible print board and the plasma display panel.

SUMMARY OF THE INVENTION

In the connection structure wherein the to-be-connected body and the wiring board are connected merely by the electrically conductive resin for electrical conduction between the electric contacts of the to-be-connected body and the board-side contacts of the wiring board, the connection strength between the to-be-connected body and the wiring board is insufficient, as compared with the arrangement in which the to-be-connected body and the wiring board are connected using the solders. In this instance, the wiring board tends to peel off and be shifted from the to-be-connected body.

Accordingly, if it is attempted to improve the connection strength between the to-be-connected body and the wiring board in the above-described structure in which the electrically conductive resin for electrical conduction of the electric contacts of the to-be-connected body and the wiring board are utilized for connection therebetween, it is general to dispose, as the reinforcement portion, electrically conductive resin by using the same material as the electrically conductive resin (the conductive portion) for electrical conduction of the electric contacts.

In the meantime, the wiring board includes a flexible base on which are formed wirings and board-side contacts. In the wiring board, the board-side contacts are exposed while the wirings are covered with a protective cover film such as a solder resist. In this instance, the reinforcement portion is usually disposed so as to overlap only one of the surface of the cover film and the surface of the flexible base. It is, however, revealed that such an arrangement does not ensure enough connection strength between the to-be-connected body and the wiring board.

It is therefore an object of the invention to provide a connection structure and a connection method of the wiring board in which the connection strength between the to-be-connected body and the wiring board is enhanced.

The above-indicated object of the invention may be achieved according to a first aspect of the invention, which provides a connection structure for connecting a wiring board to a to-be-connected body having electric contacts, the wiring board including: a flexible base formed of electrically insulating resin and having board-side contacts which are provided on a facing surface of the flexible base that is to face the to-be-connected body; and a cover film which covers the facing surface of the flexible base except the board-side contacts and a non-covered partial region of the facing surface, the connection structure comprising:

conduction portions which are formed of electrically conductive resin including a metal material and thermosetting rein and each of which bonds a corresponding one of the electric contacts of the to-be-connected body and a corresponding one of the board-side contacts of the wiring board to each other so as to permit electrical conduction therebetween, and a reinforcement portion formed of the same electrically conductive resin as the conduction portions and disposed at a position which is different from positions of the conductive portions and at which the reinforcement portion extends across both of a surface of the cover film and a surface of the non-covered partial region of the flexible base, the reinforcement portion bonding the to-be-connected body and the wiring board to each other for reinforcing connection therebetween.

The above-indicated object of the invention may be achieved according to a second aspect of the invention, which provides a method of connecting, to a to-be-connected body having electric contacts, a wiring board including: (a) a flexible base formed of electrically insulating resin and having board-side contacts which are provided on a facing surface of the flexible base that is to face the to-be-connected body; and (b) a cover film which covers the facing surface of the flexible base except the board-side contacts and a non-covered partial region of the facing surface, the method comprising the steps of:

a first application step of applying electrically conductive resin including a metal material and thermosetting resin to one of: the respective board-side contacts of the wiring board; and the respective electric contacts of the to-be-connected body, for permitting electrical conduction therebetween, a second application step of applying the electrically conductive resin to one of: a region of the wiring board which extends across both of a surface of the cover film and a surface of the non-covered partial region of the flexible base; and a region of the to-be-connected body that is to face the region of the wiring board, for reinforcing connection between the to-be-connected body and the wiring board; and a bonding step of bonding the to-be-connected body and the wiring board by pressing, while heating, the to-be-connected body and the wiring board with the electric contacts of the to-be-connected body and the board-side contacts of the wiring board positioned relative to each other, after the first application step and the second application step.

BRIEF DESCRIPTION OF THE DRAWINGS

The above and other objects, features, advantages and technical and industrial significance of the present invention will be better understood by reading the following detailed description of embodiments of the invention, when considered in connection with the accompanying drawings, in which:

FIGS. 7A-7E are photographs each for explaining a connection strength between a piezoelectric actuator and the COF, more specifically.

FIGS. 8A-8C are views for explaining a procedure of connecting a piezoelectric actuator and a COF, more specifically.

DETAILED DESCRIPTION OF THE EMBODIMENTS

There will be hereinafter described one embodiment of the invention with reference to the drawings. In the present embodiment, the invention is applied to an ink-jet printer having an ink-jet head for jetting ink to a recording sheet.

Figure 1:
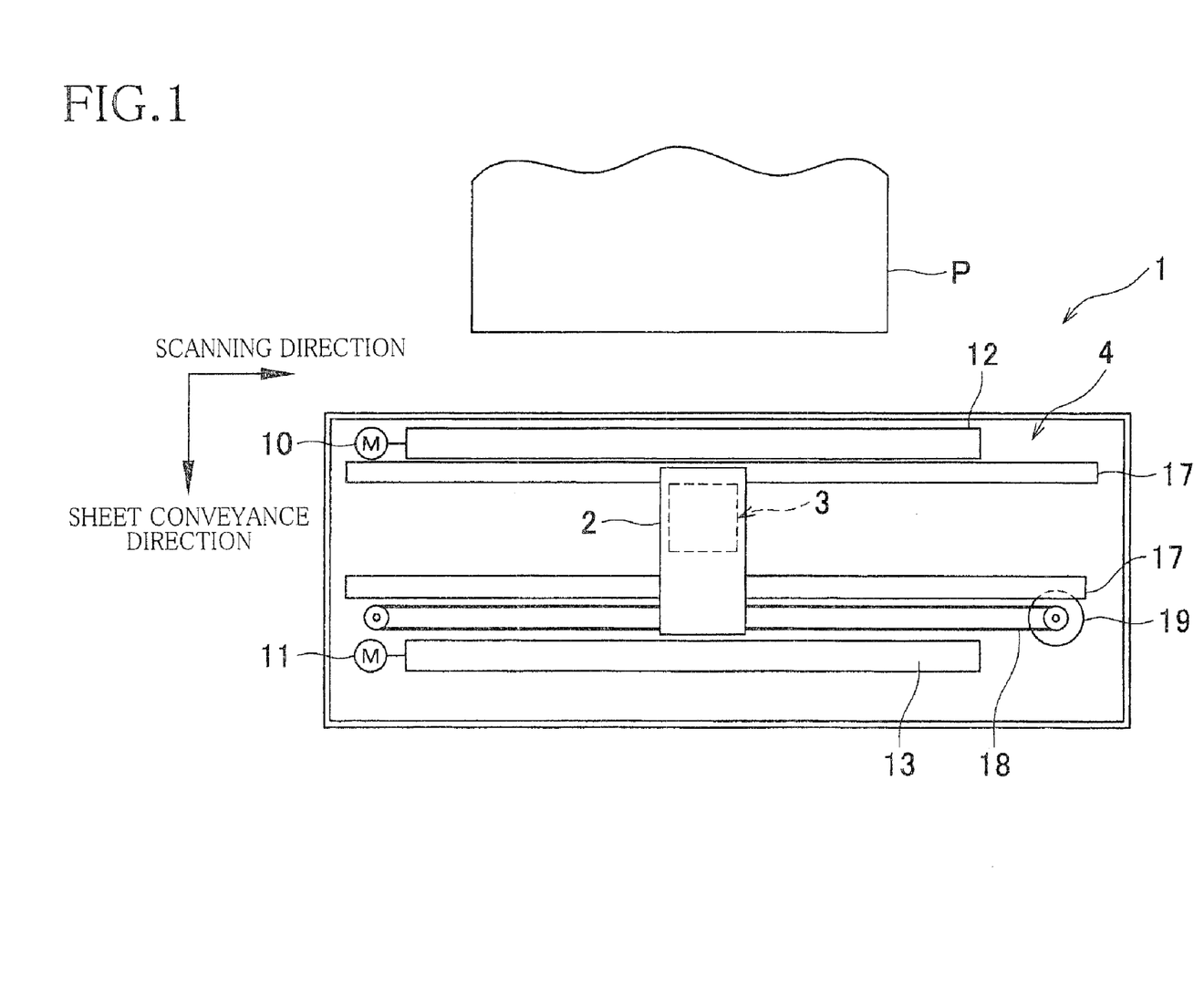
FIG. 1 is a plan view schematically showing a printer according to one embodiment of the invention.

Referring first to FIG. 1, there will be first explained a structure of a printer 1 of the present embodiment. The printer 1 includes a carriage 2 configured to reciprocate in a scanning direction, namely, a left-right direction in FIG. 1, an ink-jet head 3 mounted on the carriage 2, and a conveyor mechanism 4 configured to convey a recording sheet P in a sheet conveyance or transfer direction orthogonal to the scanning direction.

The carriage 2 is configured to reciprocate along two guide shafts 17 extending parallel with the scanning direction. To the carriage 2, an endless belt 18 is connected. When the endless belt 18 is driven by a carriage drive motor 19 to move, the carriage 2 moves in the scanning direction in accordance with the movement of the endless belt 18.

The ink-jet head 3 mounted on the carriage 2 has a plurality of nozzles 35 (FIG. 5) formed in its lower surface. The ink-jet head 3 is configured to jet, from the plurality of nozzles 35, inks supplied from respective ink cartridges (not shown) to the recording sheet P conveyed by the conveyor mechanism 4 in the sheet conveyance or transfer direction, namely, in a downward direction in FIG. 1.

The conveyor mechanism 4 includes: a sheet supply roller 12 disposed upstream of the ink-jet head 3 in the sheet conveyance direction in which the recording sheet P is conveyed by the conveyor mechanism 4; and a sheet discharge roller 13 disposed downstream of the ink-jet head 3 in the sheet conveyance direction. The sheet supply roller 12 and the sheet discharge roller 13 are rotatably driven by a sheet supply motor 10 and a sheet discharge motor 11, respectively. The conveyor mechanism 4 is configured such that the recording sheet P is conveyed by the sheet supply roller 12 from the upper side in FIG. 1 to the ink-jet head 3 and such that the recording sheet P on which images and characters have been recorded by the ink-jet head 3 is discharged to the lower side in FIG. 1 by the sheet discharge roller 13.

Figure 2:
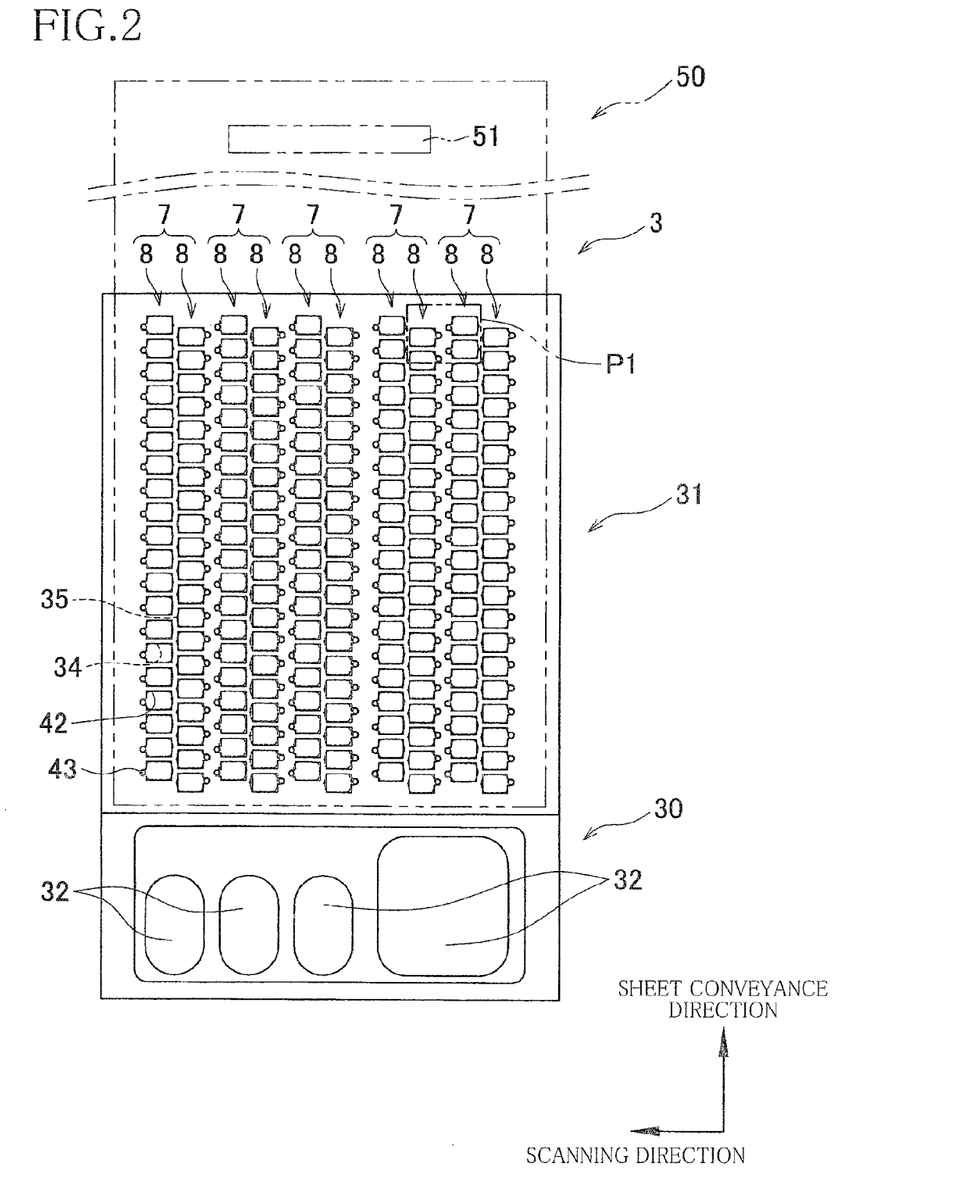
FIG. 2 is a plan view showing an ink-jet head.
Figure 3:
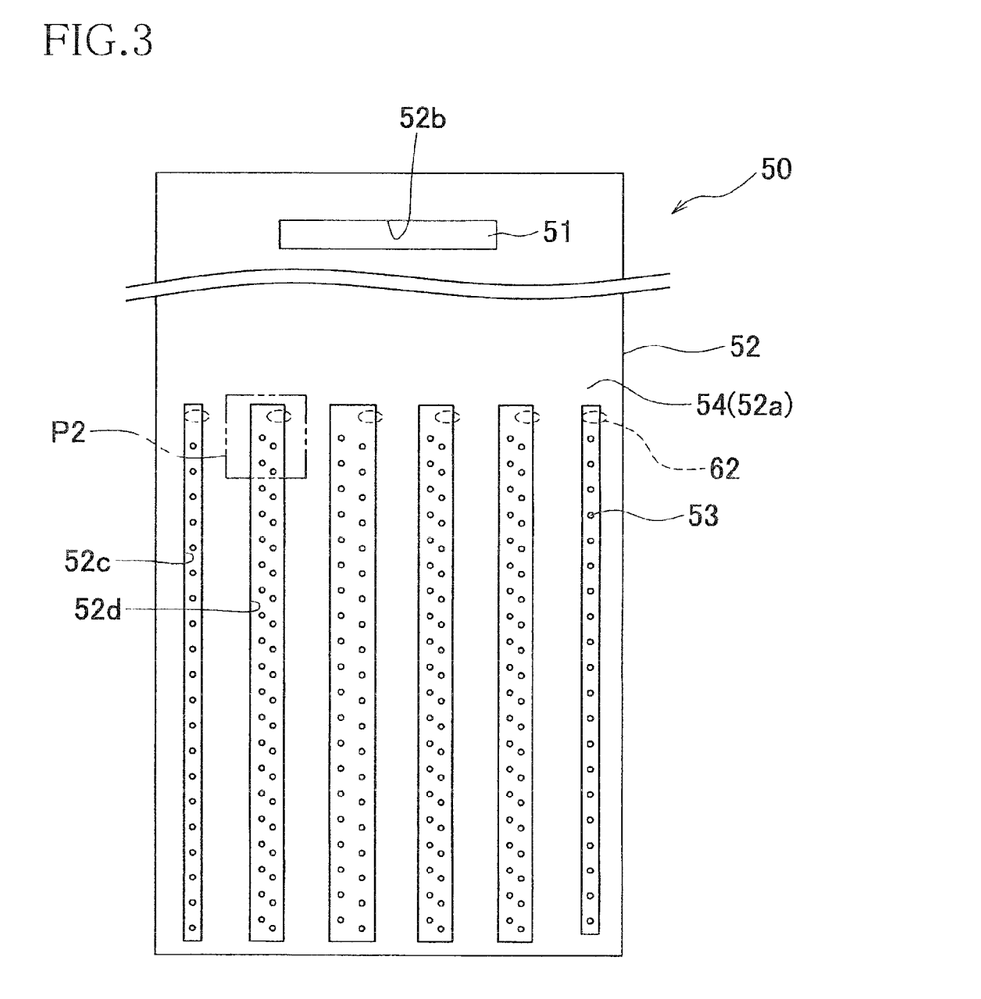
FIG. 3 is a plan view of a Chip On Film (COF)
Figure 4A:
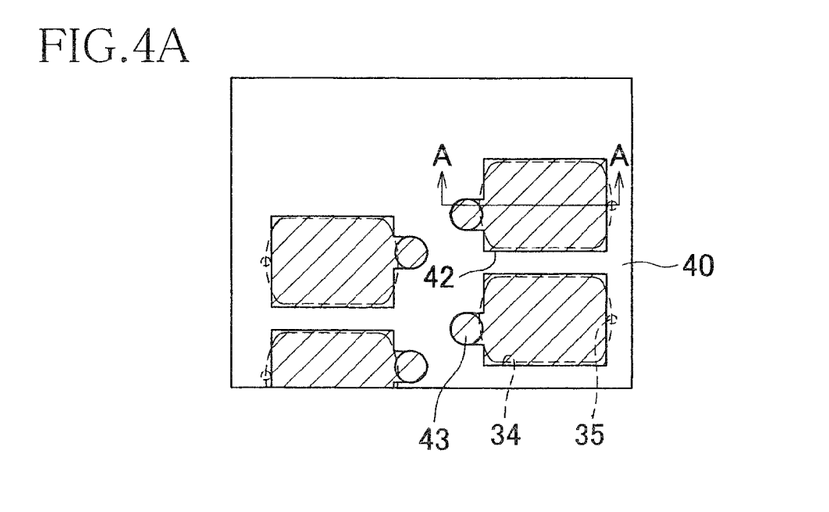
FIG. 4A is an enlarged view of a portion indicated by "P1" in FIG. 2
Figure 4B:
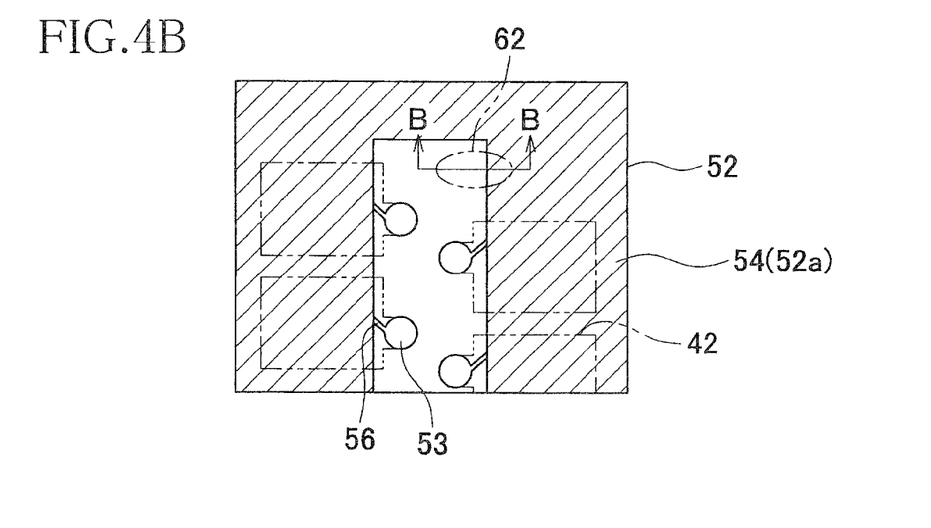
FIG. 4B is an enlarged view of a portion indicated by "P2" in FIG. 3.

Next, the ink-jet head 3 will be explained with reference to FIGS. 2-5. FIG. 2 shows the ink-jet head 3 seen from the side of a Chip On Film (COF) 50 that will be later described while FIG. 3 shows the COF 50 seen from the side of the ink-jet head 3. In the plan view of FIG. 2, the COF 50 disposed above a piezoelectric actuator 31 (that will be later described) is illustrated by the long dashed double-short dashed line. In the plan view of FIG. 3, wirings for connecting a driver IC 51 and board-side contacts 53 (both of them will be later described) are not illustrated. In FIG. 4A, individual electrodes 43 (that will be later described) are hatched. In FIG. 4B, a solder resist 54 (that will be later described) is hatched.

As shown in FIGS. 2-5, the ink-jet head 3 includes a flow-passage unit 30 in which ink channels are formed, the piezoelectric actuator 31 (as a to-be-connected body) for giving a jetting pressure to the ink in the ink channels of the flow-passage unit 30, and a wiring board 50, i.e., the COF 50, covering the upper surface of the piezoelectric actuator 31.

As shown in FIG. 2, there are formed, in the flow-passage unit 30, four ink supply holes 32 connected to the respective four ink cartridges (not shown), manifolds 33 connected to the respective ink supply holes 32 and extending in the up-down direction in FIG. 2, namely, in the sheet conveyance direction, a plurality of pressure chambers 34 communicating with the corresponding manifolds 33, and the nozzles 35 communicating with the respective pressure chambers 34.

In the ink-jet head 3, there is constituted one row 8 of the pressure chambers 34, namely, one pressure-chamber row 8, which includes a plurality of pressure chambers 34 arranged along the corresponding manifold 33 that extends in the sheet conveyance direction. Further, one pressure-chamber group 7 is constituted by two adjacent pressure-chamber rows 8 which are located adjacent to each other in the scanning direction. Accordingly, there are formed, in the flow-passage unit 30, five pressure-chamber groups 7 arranged in the scanning direction, as shown in FIG. 2. To the pressure chambers 34 of two of the five pressure-chamber groups 7 located on the right side in FIG. 2, a black ink is supplied from a corresponding one of the four ink supply holes 32. To the pressure chambers 34 of respective three of the five pressure-chamber groups 7 located on the left side in FIG. 2, three color inks, i.e., a yellow ink, a magenta ink, and a cyan ink, are respectively supplied from the corresponding three of the four ink supply holes 32.

The nozzles 35 communicating with the respective pressure chambers 34 are formed through the lower surface of the flow-passage unit 30. The nozzles 35 are arranged in a fashion similar to the pressure chambers 34. More specifically, two nozzle groups corresponding to the right-side two pressure-chamber groups 7 are disposed on the right side in FIG. 2 for jetting the black ink, and three nozzle groups corresponding to the left-side three pressure-chamber groups 7 are disposed on the left side in FIG. 2 for jetting the respective three color inks.

Figure 5:
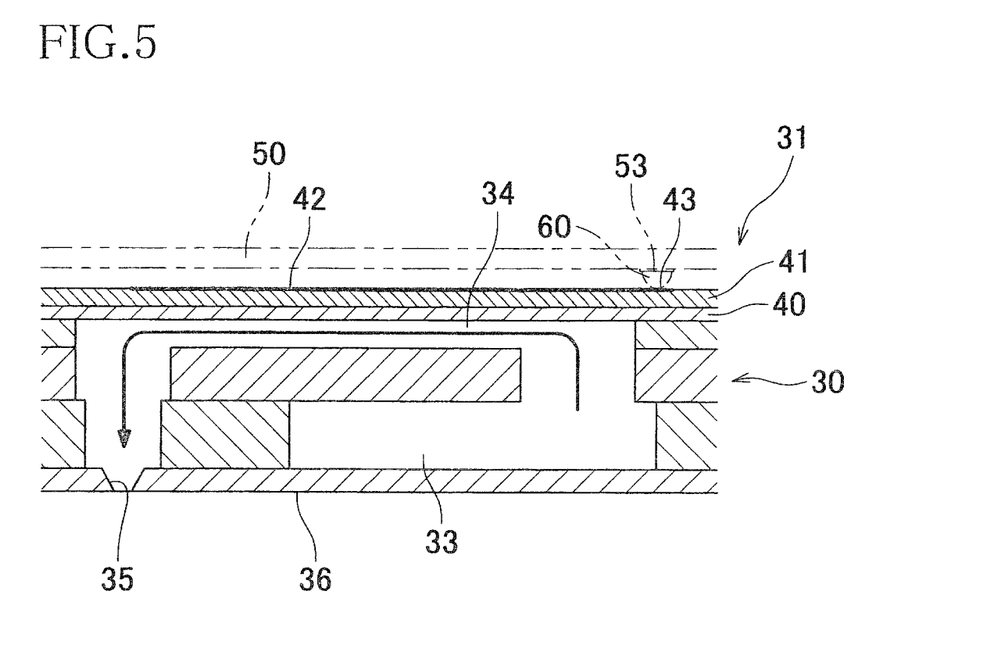
FIG. 5 is a cross-sectional view taken along line A-A in FIG. 4A.

The piezoelectric actuator 31 includes an oscillating plate 40 bonded to the flow-passage unit 30 so as to cover the pressure chambers 34, a piezoelectric layer 41 disposed on the upper surface of the oscillating plate 40, a plurality of individual electrodes 42 provided on the piezoelectric layer 41 so as to correspond to the respective pressure chambers 34, and a plurality of input contacts 43 (each as an electric contact) each of which is formed at an end of a corresponding one of the individual electrodes 42.

The piezoelectric actuator 31 is configured to cause flexure deformation in the oscillating plate 40 utilizing piezoelectric strain generated in the piezoelectric layer 41 when a predetermined drive signal is supplied to the individual electrodes 42 from the driver IC 51 of the COF 50 (that will be later explained). The flexure deformation of the oscillating plate 40 causes volume variations in the pressure chambers 34 corresponding to the signal-supplied individual electrodes 42, whereby a pressure is given to the ink in the pressure chambers 34 and the ink is jetted from the nozzles 35 communicating with the pressure chambers 34. The input contacts 43 are disposed so as to be spaced apart from each other by a predetermined distance in the sheet conveyance direction, so as to correspond to the nozzles 35. Further, the rows of the input contacts 43 each extending in the sheet conveyance direction are arranged in the scanning direction.

Next, the COF 50 will be explained. As shown in FIGS. 2 and 5, the COF 50 is connected to the upper surface of the piezoelectric actuator 31 on which the individual electrodes 42 are disposed. The COF 50 is drawn or extends, along the sheet conveyance direction, from one side of the flow-passage unit 30 that is remote from the ink supply holes 32, and is folded upward. The driver IC 51 is disposed in the vicinity of the leading end portion of the COF 50 that is drawn or extends from the one side of the flow-passage unit 30.

As shown in FIGS. 3 and 4B, the COF 50 includes a base 52, a plurality of board-side contacts 53 formed on one surface of the base 52, the driver IC 51 mounted on the one surface of the base 52 on which the board-side contacts 53 are formed, and the solder resist 54 as a cover film covering the one surface of the base 52 on which the board-side contacts 53 are formed.

The base 52 is a rectangular, electrically insulating substrate formed of a polyimide film and has flexibility. The board-side contacts 53 are formed of metal foil such as copper foil and are formed on a lower surface 52a (as a facing surface) of the base 52 that faces the piezoelectric actuator 31 when the COF 50 is connected to the upper surface of the piezoelectric actuator 31. More specifically, the board-side contacts 53 are disposed on the lower surface 52a such that the board-side contacts 53 are spaced apart from each other by a suitable distance in the longitudinal direction of the base 52 so as to face the respective input contacts 43 of the piezoelectric actuator 31. Further, the rows of the board-side contacts 53 each extending in the longitudinal direction of the base 52 are arranged in the width direction of the base 52. The board-side contacts 53 are connected to the driver IC 51 by respective wirings 56 (FIG. 4B) formed on the base 52.

The driver IC 51 is for supplying a drive signal to the individual electrodes 42 through the respective wirings 56. The drive signal supplied by the driver IC 51 is a pulse signal generated by switching a potential between a power potential and a ground potential. The diameter and the jetting timing of droplets to be jetted from the nozzles 35 vary depending upon the waveform of the pulse signal.

The solder resist 54 is formed of electrically insulating resin and covers the lower surface 52a of the base 52 except: a partial region 52b on which the driver IC 51 is mounted; two outermost partial regions 52c each of which encloses a corresponding one of two outermost rows of the board-side contacts 53, which two outermost rows are located at respective widthwise opposite ends of the base 52; and three intermediate partial regions 52d each of which encloses corresponding two rows of the board-side contacts 53 that are adjacent in the scanning direction, other than the two outermost rows. That is, the driver IC 51, the board-side contacts 53, and local regions of the lower surface 52a of the base 52 around the board-side contacts 53 are exposed, namely, not being covered with the solder resist 54.

Figure 6:
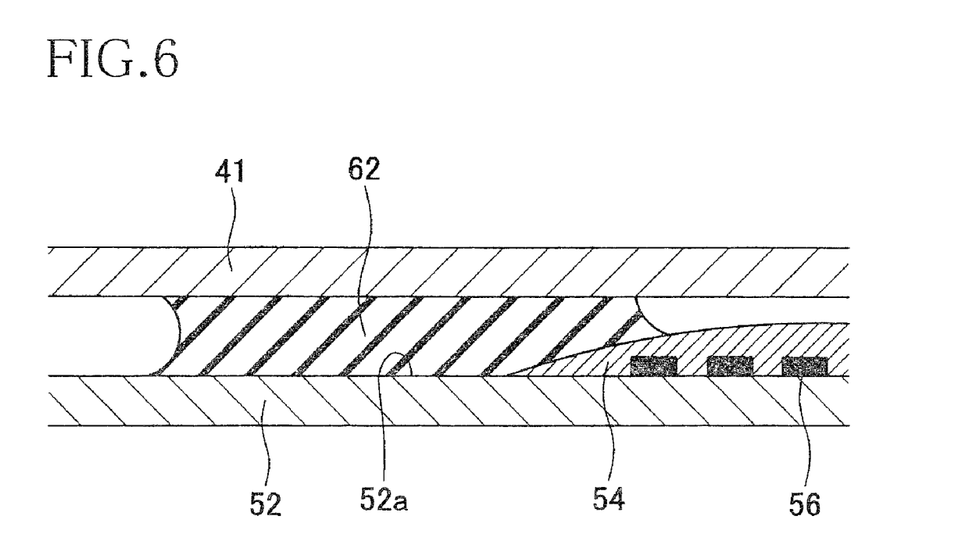
FIG. 6 is a cross-sectional view taken along line B-B in FIG. 4B.

There will be next explained a connection structure between the COF 50 and the piezoelectric actuator 31 with reference to FIGS. 3-6. FIG. 6 is a cross-sectional view showing not the COF 50 alone, but the COF 50 to which the piezoelectric actuator 31 is already connected. Further, in FIG. 6, the oscillating plate 40 of the piezoelectric actuator 31 is not illustrated, and the COF 50 and the piezoelectric actuator 31 are illustrated upside down. The COF 50 is mechanically connected to the piezoelectric actuator 31 by: a plurality of conduction portions 60 (FIG. 5) which mechanically connect the respective board-side contacts 53 of the COF 50 and the respective input contacts 43 of the piezoelectric actuator 31 facing one another, while permitting electrical conduction or connection therebetween; and a plurality of reinforcement portions 62 for enhancing the connection strength between the COF 50 and the piezoelectric actuator 31.

Each of the conduction portions 60 is formed of electrically conductive resin containing a metal material and thermosetting resin and is provided between a corresponding one of the board-side contacts 53 of the base 52 and a corresponding one of the input contacts 43 of the piezoelectric actuator 31 for thereby permitting electrical conduction therebetween and bonding the board-side contact 53 and the input contact 43.

The reinforcement portions 62 are formed of the same electrically conductive resin as the conduction portions 60 and are disposed between the base 52 and the piezoelectric actuator 31 such that the reinforcement portions 62 are arranged in one row in the scanning direction, so as to be located closer to the extended or drawn side of the COF 50 (on which the driver IC 51 is disposed), as compared with the conduction portions 60. In other words, the reinforcement portions 62 are disposed ahead of the conduction portions 60 in the direction in which the COF 50 extends or is drawn, namely, disposed on a more forward side in the direction than the conduction portions 60. Each reinforcement portion 62 has an oval shape, in plan view, that is elongate in the scanning direction and is disposed, on the bonded surface of the COF 50, at a position at which the reinforcement portion 62 extends across both of: the surface of the base 52 at a corresponding one of the partial regions 52c, 52d enclosing the corresponding row or rows of the board-side contacts 53; and the surface of the solder resist 54. The conduction portions 60 and the reinforcement portions 62 are formed by applying a paste of the electrically conductive resin to predetermined positions of the base 52 or the piezoelectric actuator 31 and subsequently pressing, while heating, the COF 50, onto the piezoelectric actuator 31, so that the electrically conductive resin is cured to thereby form the conduction portions 60 and the reinforcement portions 62.

In the meantime, the COF 50 is used in a state in which the COD 50 is folded upward, i.e., folded in a direction away from the piezoelectric actuator 31. Accordingly, it is needed to enhance the connection strength between the piezoelectric actuator 31 and the COF 50 so as to prevent the COF 50 from peeling off from the piezoelectric actuator 31 against a force to act in a direction in which the COF 50 separates away from the piezoelectric actuator 31.

However, the piezoelectric layer 41 of the piezoelectric actuator 31 tends to be fractured when it receives too much pressure applied thereto. Further, when the electrically conductive resin that forms each of the conduction portions 60 receives too much pressure, the resin tends to overflow or extend beyond the corresponding input contact 43 toward the corresponding individual electrode 42. Where the resin flows or extends over the individual electrode 42, a portion of the oscillating plate 40 which is opposed to a corresponding portion of the piezoelectric layer 41 overlapping the individual electrode 42 is hindered from undergoing flexure deformation. Consequently, the jetting performance of the ink from the nozzle 35 is deteriorated. It is therefore difficult to enhance the connection strength by increasing a pressing force by which the COF 50 is pressed onto the piezoelectric actuator 31 for bonding therebetween, without suffering the problems indicated above.

In view of the above, in the present embodiment, the piezoelectric actuator 31 and the COF 50 are bonded by the reinforcement portions 62 for the purpose of reinforcing connection therebetween, in addition to the conduction portions 60. Further, each reinforcement portion 62 is bonded to the COF 50 at a position where the reinforcement portion 62 extends across both of the surface of the base 52 and the surface of the solder resist 54 for further enhancing the connection strength.

In an instance where each reinforcement portion 62 is bonded only to the surface of the base 52 of the COF 50 (hereinafter this instance is referred to "Comparative Example 1" where appropriate), the strength of the reinforcement portion 62 per se is relatively high. In this arrangement according to the Comparative Example 1, when the COF 50 is removed or stripped away from the piezoelectric layer 41 of the piezoelectric actuator 31, the COF 50 peels off or separates from the piezoelectric layer 41 at the bonded surface between the base 52 and the reinforcement portion 62, and a so-called interfacial fracture is generated.

In another instance where each reinforcement portion 62 is bonded only to the surface of the solder resist 54 (hereinafter this instance is referred to "Comparative Example 2" where appropriate), the reinforcement portion 62 suffers from a large number of cracks and the strength of the reinforcement portion 62 per se is relatively low. This is because the solder resist 54 to which the reinforcement portion 62 is bonded in the Comparative Example 2 is harder than the base 52 to which the reinforcement portion 62 is bonded in the Comparative Example 1.

More specifically, in the Comparative Example 1, when the base 52 and the piezoelectric layer 41 are bonded by the paste of the electrically conductive resin applied therebetween and the resin is subsequently cured, the base 52 follows thermal shrinkage of the resin at the time of curing thereof and undergoes slight flexure in a direction toward the piezoelectric layer 41 by being pulled by the resin. Therefore, the cracks are not present in the reinforcement portion 62 formed by curing of the resin. In the Comparative Example 2, on the other hand, when the solder resist 54 and the piezoelectric layer 41 are bonded by the paste of the electrically conductive resin applied therebetween and the resin is subsequently cured, the solder resist 54 does not follow thermal shrinkage of the resin at the time of curing thereof because of its hardness and hinders the thermal shrinkage. Therefore, a large number of cracks are present in the reinforcement portion 62 formed by curing of the resin. Accordingly, when the COF 50 is removed or stripped away from the piezoelectric layer 41, a fracture occurs from the cracks.

In contrast, in the arrangement according to the present embodiment (hereinafter referred to as "Example" where appropriate) wherein each reinforcement portion 62 is disposed at a position at which the reinforcement portion 62 extends across both of the surface of the base 52 and the surface of the solder resist 54 as shown in FIG. 6, when the COF 50 and the piezoelectric layer 41 are bonded by the paste of the electrically conductive resin applied therebetween and the resin is subsequently cured, a portion of the base 52 bonded to the resin follows thermal shrinkage of the resin at the time of curing thereof and undergoes slight flexure in a direction toward the piezoelectric layer 41 by being pulled by the resin. Accordingly, in addition to the resin between the base 52 and the piezoelectric layer 41, the resin between the solder resist 54 and the piezoelectric layer 41 thermally shrinks under the influence of the flexure. Therefore, the cracks are not present in the reinforcement portion 62 formed by curing of the resin.

In the above arrangement, when the COF 50 is removed or stripped away from the piezoelectric layer 41 of the piezoelectric actuator 31, the COF 50 peels off or separates from the piezoelectric layer 41 at the bonded surface between the base 52 and the reinforcement portion 62 at a portion where the reinforcement portion 62 is bonded to the surface of the base 52, while, at a portion where the reinforcement portion 62 is bonded to the surface of the solder resist 54, the COF 50 does not peel off or separate at the bonded surface between the solder resist 54 and the reinforcement portion 62, but peels off or separates as a result of a fracture of the solder resist 54, causing a so-called fracture in base material.

When the Comparative Example 1 and the Comparative Example 2 are compared, the degree of chemical bond or linkage and the degree of bonding strength are higher in the bonding of the electrically conductive resin and the solder resist 54 formed of the insulating resin in the Comparative Example 2 than in the bonding of the electrically conductive resin and the base 52 having electrically insulating property and formed of polyimide film in the Comparative Example 1. Accordingly, the present embodiment ensures the bonding strength at the bonded surface higher than that in the Comparative Example 1 and ensures a higher strength of the reinforcement portion 62 per se than in the Comparative Example 2. Hence, it is to be understood that the present embodiment ensures a higher degree of bonding strength than the Comparative Examples 1 and 2.

Figure 7A:
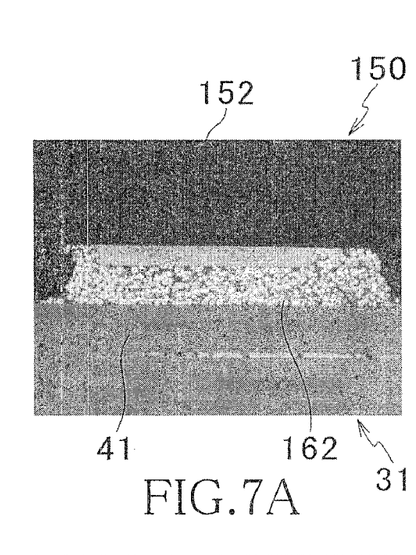
FIG. 7A is a view in vertical cross section showing a COF and a piezoelectric actuator, together with a reinforcement portion in Comparative Example 1.
Figure 7B:
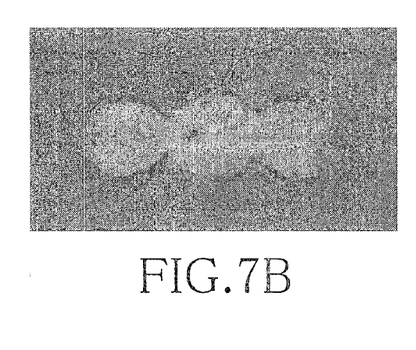
FIG. 7B is a peeled surface on a COF side in the Comparative Example 1.
Figure 7C:
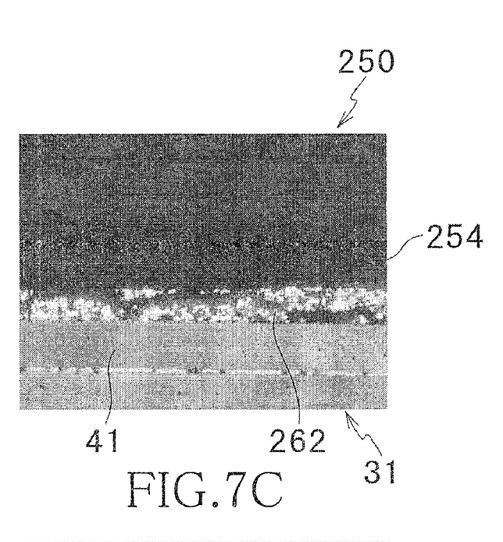
FIG. 7C is a view in vertical cross section showing a COF and a piezoelectric actuator, together with a reinforcement portion in Comparative Example 2.
Figure 7D:
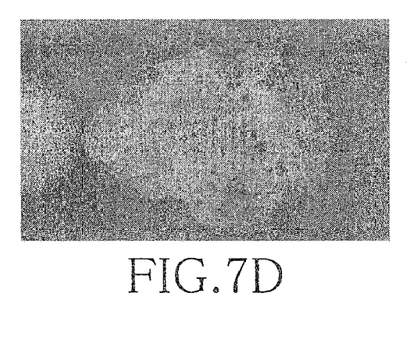
FIG. 7D is a peeled surface on a COF side in the Comparative Example 2.
Figure 7E:
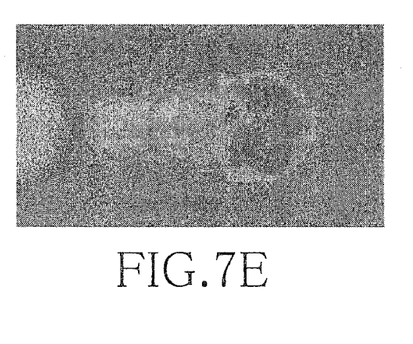
FIG. 7E is a peeled surface on a COF side in Example of the embodiment.

Referring next to FIGS. 7A-7E, there will be explained examination results as to the connection strength between the piezoelectric actuator 31 and the COF 50 when a bonding position of the reinforcement portions 62 with respect to the COF 50 is variously changed. FIGS. 7A-7G are photographs each for explaining the connection strength between the piezoelectric actuator 31 and the COF 50. More specifically, FIG. 7A shows a vertical cross section of a COF and a piezoelectric actuator, together with a reinforcement portion, in the Comparative Example 1. FIG. 7B shows a COF-side peeled surface in the Comparative Example 1. FIG. 7C shows a vertical cross section of a COF and a piezoelectric actuator, together with a reinforcement portion, in the Comparative Example 2. FIG. 7D shows a COF-side peeled surface in the Comparative Example 2. FIG. 7E shows a COF-side peeled surface in the present embodiment.

Here, as the base 52, there is used a rectangular insulating base formed of a polyimide film having a thickness of 38 μm (i.e., "Kapton EN-C" available from DuPont). Further, as the solder resist 54, there is used a polyimide insulating resin (i.e., "SN-9000" available from Hitachi Chemical Co., Ltd.). The electrically conductive resin that provides the conduction portions 60 and the reinforcement portions 62 is composed of Ag as the metal material and epoxy resin as the thermosetting resin. About 80% of the electrically conductive resin is constituted by Ag and the remainder is constituted by the epoxy resin.

As mentioned above, the arrangement according to the present embodiment in which each reinforcement portion 62 is bonded to a position on the COF 50 at which the reinforcement portion 62 extends across both of the surface of the base 52 and the surface of the solder resist 54 is referred to as the Example. The arrangement in which the reinforcement portion 62 is bonded only to the surface of the base 52 is referred to as the Comparative Example 1. The arrangement in which the reinforcement portion is bonded only to the surface of the solder resist 54 is referred to as the Comparative Example 2. In each arrangement, there is examined the state of the peeled surface on the COF 50 when the COF 50 is removed or stripped away from the piezoelectric actuator 31.

In the Comparative Example 1 shown in FIG. 7A, a reinforcement portion 162 is bonded only to a surface of a base 152 of a COF 150. In this arrangement, the strength of the reinforcement portion 162 per se is relatively high. When the COF 150 is removed or stripped away from the piezoelectric layer 41 of the piezoelectric actuator 31, the COF 150 peels off or separates at the bonded surface between the base 152 and the reinforcement portion 162 as shown in FIG. 7B. Thus, the so-called interfacial fracture is generated.

In the Comparative Example 2 shown in FIG. 7C, a reinforcement portion 262 is bonded only to a surface of a solder resist 254 of a COF 250. In this arrangement, many cracks (shown as black-line portions in the reinforcement portion 262 in FIG. 7C) are generated in the reinforcement portion 262. It is accordingly understood that the strength of the reinforcement portion 262 per se is relatively low. This is because the solder resist 254 to which the reinforcement portion 162 is bonded in the Comparative Example 2 is harder than the base 152 to which the reinforcement portion 162 is bonded in the Comparative Example 1. When the COF 250 is removed or striped away from the piezoelectric layer 41, the fracture is caused from the cracks as shown in FIG. 7D.

In the Example according to the present embodiment shown in FIG. 6, each reinforcement portion 62 is bonded to a position at which the reinforcement portion 62 extends across both of the surface of the base 52 and the surface of the solder resist 54. When the COF 50 and the piezoelectric layer 41 are bonded by the paste of the electrically conductive resin and the resin is subsequently cured, the cracks are not present in the reinforcement portion 62 formed by curing of the resin.

In the above arrangement, when the COF 50 is removed or stripped away from the piezoelectric layer 41, the COF 50 peels off or separates at the bonded surface between the base 52 and the reinforcement portion 62 at a portion where the reinforcement portion 62 is bonded to the surface of the base 52, while, at a portion where the reinforcement portion 62 is bonded to the surface of the solder resist 54, the COF 50 does not peel off or separate at the bonded surface between the solder resist 54 and the reinforcement portion 62, but peels off or separates as a result of a fracture of the solder resist 54, causing the so-called fracture in the material. It is to be understood from the above examination results that the connection strength is higher in the Example than in the Comparative Examples 1 and 2.

Figure 8A:
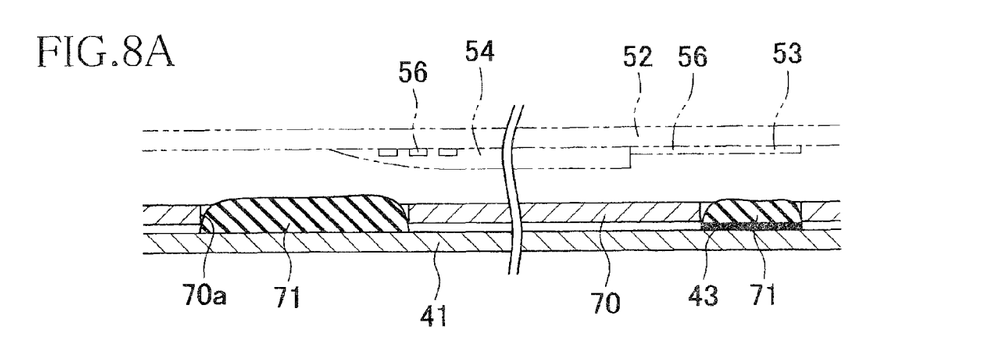
FIG. 8A shows application steps.
Figure 8B:
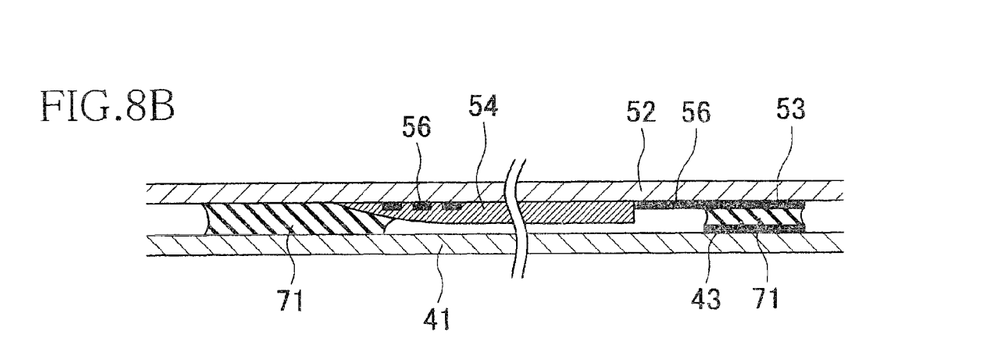
FIG. 8B shows a bonding step.
Figure 8C:
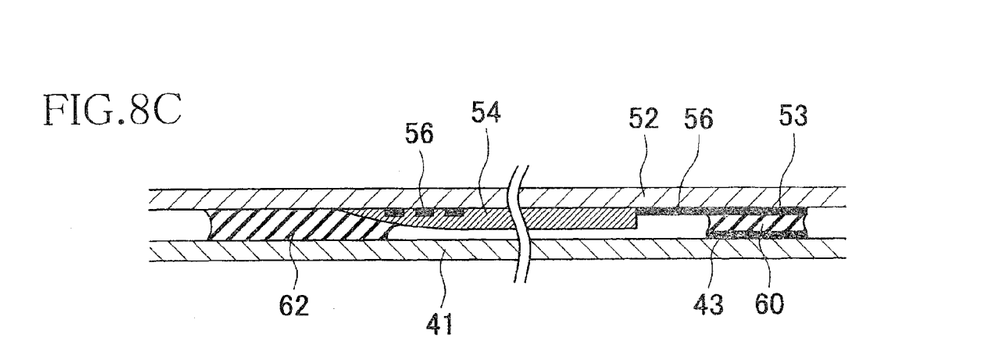
FIG. 8C shows a state in which connection is completed.

Referring next to FIGS. 8A-8C, there will be explained a method of connecting the piezoelectric actuator 31 and the COF 50. FIG. 8A shows a first application step and a second application step explained below. FIG. 8B shows a bonding step. FIG. 8C shows a state in which the connection is completed. In FIGS. 8A-8C, only the piezoelectric layer 41 of the piezoelectric actuator 31 is illustrated without illustrating oscillating plate 40. Each of FIGS. 8A-8C does not show one cross section perpendicular to the sheet conveyance direction, but shows two cross sections which are cut at different positions in the sheet conveyance direction, for the purpose of illustrating a cross section of the conduction portion 60 perpendicular to the sheet conveyance direction and a cross-section of the reinforcement portion 62 perpendicular to the sheet conveyance direction, which reinforcement portion 62 extends across both of the surface of the base 52 of the COF 50 and the surface of the solder resist 54.

As shown in FIG. 8A, a mask 70 is initially disposed on the piezoelectric layer 41. The mask 70 has mask holes 70a corresponding to the input contacts 43 on the surface of the piezoelectric layer 41 of the piezoelectric actuator 31 and corresponding to areas of the COF 50 each extending across both of the surface of the base 52 and the surface of the solder resist 54. Subsequently, the paste of the electrically conductive resin is deposited on each mask hole 70a so as to form a conductive resin pad 71. Then the mask 70 is removed from the piezoelectric layer 41. In this way, the first and second application steps are carried out.

Subsequently, as shown in FIG. 8B, the COF 50 is disposed on the piezoelectric layer 41 of the piezoelectric actuator 31, such that the COF 50 faces the upper surface of the piezoelectric layer 41 and such that the longitudinal direction of the COF 50 is parallel to the sheet conveyance direction. In this instance, the COF 50 and the piezoelectric actuator 31 are positioned relative to each other such that the board-side contacts 53 of the COF 50 and the input contacts 43 of the piezoelectric actuator 31 are opposed to one another. Accordingly, not the conductive resin pads 71 on the input contacts 43, but the conductive resin pads 71 on the piezoelectric layer 41 face the respective areas each extending across both of the surface of the base 52 and the surface of the solder resist 54.

Thereafter, the COF 50 is pressed onto the piezoelectric layer 41 from the upper side in FIG. 8C while being heated by a heater (not shown). As a result, the conductive resin pads 71 on the input contacts 43 of the piezoelectric actuator 31 and the board-side contacts 53 of the COF 50 are bonded to one another while being allowed to have electrical conduction therebetween, and the conductive resin pads 71 are cured to provide the conduction portions 60. Further, each conductive resin pad 71 on the piezoelectric layer 41 is bonded to a corresponding one of the areas on the COF extending across both of the surface of the base 52 and the surface of the solder resist 54, and the conductive resin pad 71 is cured to provide the reinforcement portion 62. In this way, the bonding step is carried out. Thus, the COF 50 and the piezoelectric actuator 31 are bonded, and the COF 50 and the piezoelectric actuator 31 are accordingly connected.

In the connection structure between the piezoelectric actuator 31 and the COF 50 according to the present embodiment, each reinforcement portion 62 is disposed at the position where the reinforcement portion 62 extends across both of the surface of the base 52 and the surface of the solder resist 54 of the COF 50. Accordingly, the connection strength between the piezoelectric actuator 31 and the COF 50 can be increased, as compared with the Comparative Example 1 in which the reinforcement portion 62 is disposed only on the surface of the base 52 of the COF 50 and the Comparative Example 2 in which the reinforcement portion 62 is disposed only on the surface of the solder resist 54. Therefore, it is possible to prevent the COF 50 from being shifted and peeling off from the piezoelectric actuator 31.

In the present embodiment, the reinforcement portions 62 are arranged in the scanning direction (i.e., in the width direction of the COF 50 orthogonal to the drawn or extended direction of the COF 50) and each of them is crushed into the elongate shape that is long in the scanning direction, at a local portion of the COF 50 which extends in the scanning direction orthogonal to the drawn or extended direction of the COF 50 and on which, where a force in a direction away from the piezoelectric actuator 31 is applied to the drawn or extended portion of the COF 50, the force acts to the largest extent. In the present embodiment, owing to the thus arranged reinforcement portions 62, the connection strength can be increased at the local portion of the COF 50. Therefore, it is possible to more effectively prevent the COF 50 from being shifted and peeling off from the piezoelectric actuator 31.

Where it is attempted to increase the connection strength of the COF 50 and the piezoelectric actuator 31 by increasing adhesion of the conduction portions 60 and the reinforcement portions 62 with respect to the COF 50 and the piezoelectric actuator 31, it may be considered to increase the pressing force by which the COF 50 is pressed onto the piezoelectric actuator 31 for bonding therebetween. In this case, however, the piezoelectric layer 41 of the piezoelectric actuator 31 tends to be damaged. Accordingly, even where the COF 50 is connected to the to-be-connected body, such as the piezoelectric actuator 31 including the piezoelectric layer 41, to which a large pressing force cannot be applied, the connection strength can be increased according to the present embodiment. That is, owing to the reinforcement portions 62 each of which is disposed at the position where the reinforcement portion 62 extends across both of the surface of the base 52 and the surface of the solder resist 54 of the COF 50, the base 52 follows the thermal shrinkage of the electrically conductive resin at the time of curing thereof and accordingly undergoes slight flexure in a direction toward the piezoelectric layer 41 by being pulled by the resin. This enables thermal shrinkage of the electrically conductive resin between the solder resist 54 and the piezoelectric layer 41 as well as the electrically conductive resin between the base 52 and the piezoelectric layer 41, under the influence of the flexure described above. Accordingly, the reinforcement portions 62 formed by curing of the electrically conductive resin do not suffer from cracks. Hence, it is possible to increase the connection strength between the COF 50 and the to-be-connected body such as the piezoelectric actuator 31 to which a large pressing force cannot be applied.

In the embodiment illustrated above, in examining the connection strength between the COF 50 and the piezoelectric actuator 31, the polyimide insulating resin ("SN-9000" available from Hitachi Chemical Co., Ltd.) is used as the solder resist 54. The solder resist 54 may be formed of other materials such as epoxy insulating resin (e.g., "CCR-232GF" available from Asahi Chemical Research Laboratory Co., Ltd.) and acrylic insulating resin (e.g., PSR). Even where the epoxy insulating resin or the acrylic insulating resin is used as the solder resist, the bonded surface has strong chemical bond, ensuring advantages similar to those in the illustrated embodiment.

In the embodiment illustrated above, the polyimide film is used as the base 52. There may be employed, as the base 52, ordinary film-like substrates since such film-like substrates naturally have flexibility higher than that of the solder resist 54 and ensure advantages similar to those in the illustrated embodiment.

In the illustrated embodiment, on the bonded surface with respect to the COF 50, the section of the reinforcement portion 62 bonded to the surface of the base 52 and the section of the same 62 bonded to the surface of the solder resist 54 are disposed so as to be arranged in a direction of extension of elongate reinforcement portion 62. These sections may be arranged otherwise. For instance, the section of the reinforcement portion 62 bonded to the surface of the base 52 may enclose the section of the same 62 bonded to the solder resist 54.

In the illustrated embodiment, the conductive resin pads 71 which provide the conduction portions 60 and the reinforcement portions 62 are applied not to the COF 50, but to the piezoelectric actuator 31, in the first and second application steps. The conductive resin pads 71 may be applied to the COF 50.

In the illustrated embodiment, each reinforcement portion 62 is exclusively for mechanical connection between the COF 50 and the piezoelectric actuator 31. The reinforcement portion 62 may be utilized for electrical conduction to the ground.

Figure 9:
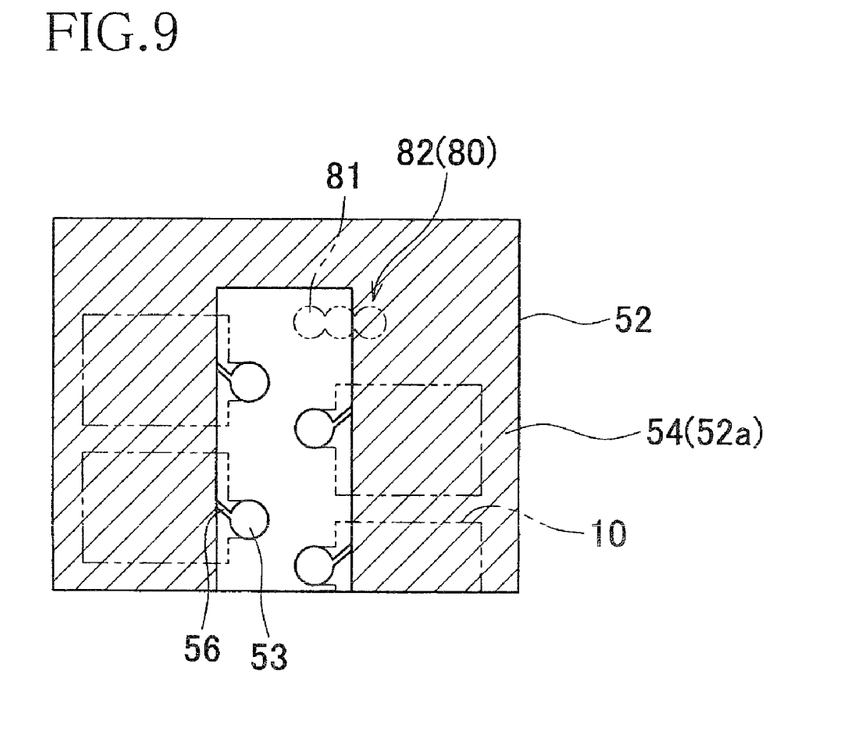
FIG. 9 is a view according to a first modified embodiment, the view being similar to FIG. 4B.

Next, with reference to FIGS. 9 and 10, there will be described modified embodiments of the invention in which the same reference numerals as used in the illustrated embodiment are used to identify the corresponding components and its detailed explanation is dispensed with.

In the embodiment illustrated above, each reinforcement portion 62 is formed of one bump of the electrically conductive resin which is crashed into the elongate shape that is long in the scanning direction. The reinforcement portion 62 may be otherwise formed. According to a first modified embodiment shown in FIG. 9, one reinforcement portion 80 is composed of a bump group 82 including a plurality of bumps 81 of the electrically conductive resin which are disposed close to each other in the scanning direction. The bumps 81 are crashed by the pressing force applied for bonding between the COF 50 and the piezoelectric actuator 31, so that the bumps 81 are bonded to one another. Since the reinforcement portion 80 is not for electrical conduction, the bumps 81 may not be bonded to one another. In the embodiment illustrated above, it is comparatively difficult to control spreading of each reinforcement portion 62 that is crashed, by the pressing force, between the COF 50 and the piezoelectric actuator 31, and there may be a risk of spreading in an unintended direction. For instance, where the reinforcement portion 62 spreads toward the conduction portion 60 located adjacent thereto and a short circuit is caused therebetween, the resistance value of the conduction portion 60 may be undesirably increased. In other words, where one large bump having the same volume as a total volume of the plurality of bumps 81 is formed as the reinforcement portion, it is comparatively difficult to control spreading of the one large bump. In the first modified embodiment, the reinforcement portion 80 is composed of the bump group 82 including the plurality of bumps 81 of the electrically conductive resin. Accordingly, it is possible to easily control the shape of the reinforcement portion 80 simply by determining locations of the respective bumps 81.

In the first modified embodiment, the plurality of bumps 81 of the bump group 82 are arranged in the scanning direction, i.e., in the width direction of the COF 50, at a local portion of the COF 50 which extends in the scanning direction orthogonal to the drawn or extended direction of the COF 50 and on which, where a force in a direction away from the piezoelectric actuator 31 is applied to the drawn or extended portion of the COF 50, the force acts to the largest extent. In the first modified embodiment, the plurality of bumps 81 that constitute the reinforcement portion 82 are arranged as described above, whereby the connection strength can be increased at the local portion of the COF 50. Therefore, it is possible to effectively prevent the COF 50 from being shifted and peeled away from the piezoelectric actuator 31.

In the illustrated embodiment, each reinforcement portion 62 is disposed at the position where the reinforcement portion 62 extends across both of the surface of the solder resist 54 and the surface of the base 52, in the scanning direction, namely, in the direction orthogonal to the drawn or extended direction of the COF 50. In other words, on the bonded surface with respect to the COF 50, the section of the reinforcement portion 62 bonded to the surface of the base 52 and the section of the same 62 bonded to the surface of the solder resist 54 are disposed so as to be arranged in the scanning direction. These sections may be otherwise arranged. According to a second modified embodiment shown in FIG. 10A, a reinforcement portion 162 is disposed at a position where the reinforcement portion 162 extends across both of the surface of the base 52 and the surface of a solder resist 154 of a COF 150 in this order, in the drawn or extended direction of the COF 150. Further, the reinforcement portion 162 is disposed on one of opposite sides of a folded position of the COF 150 in its longitudinal direction, which one side is nearer to the board-side contacts 53. In the second modified embodiment, a part of the solder resist 154 has an arcuate shape shown in FIG. 10A, and the reinforcement portion 162 is formed to extend across the surface of the base 52 and the surface of the arcuate part of the solder resist 154. According to the arrangement wherein the reinforcement portion 162 is disposed away from the folded position of the COF 150, a force applied to the reinforcement portion 162 when folding the COF 150 becomes small, thereby preventing the COF 50 from peeling off from the piezoelectric actuator 31. Moreover, the reinforcement portion 162 extends over the arcuate part of the solder resist 154, whereby the connection strength becomes higher.

Figure 10A:
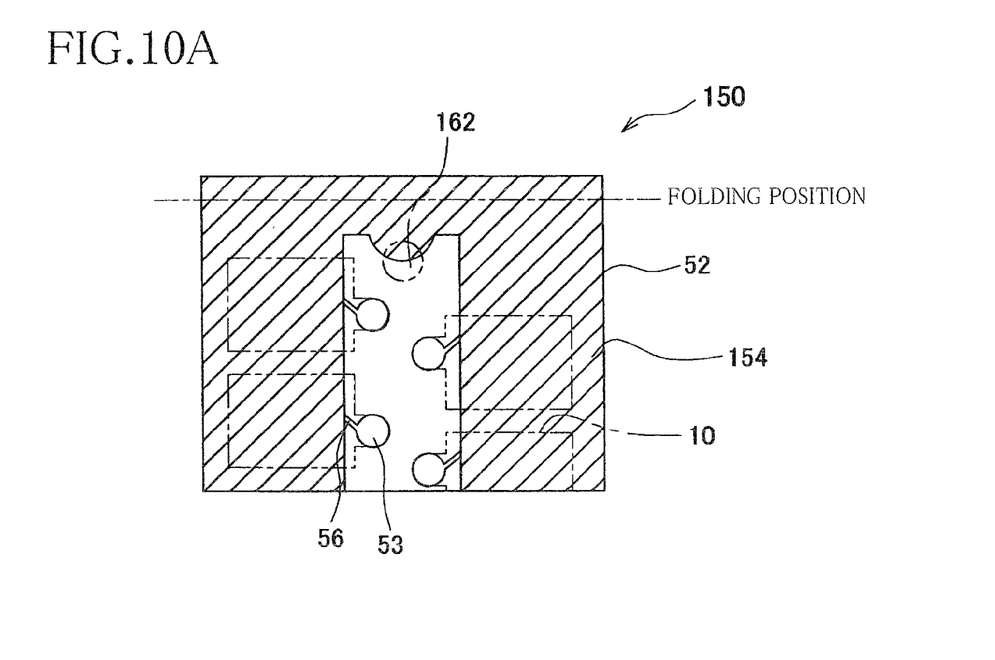
FIG. 10A is a view according to a second modified embodiment and FIG. 10B is a view according to a third modified embodiment, the views being similar to FIG. 4B.
Figure 10B:
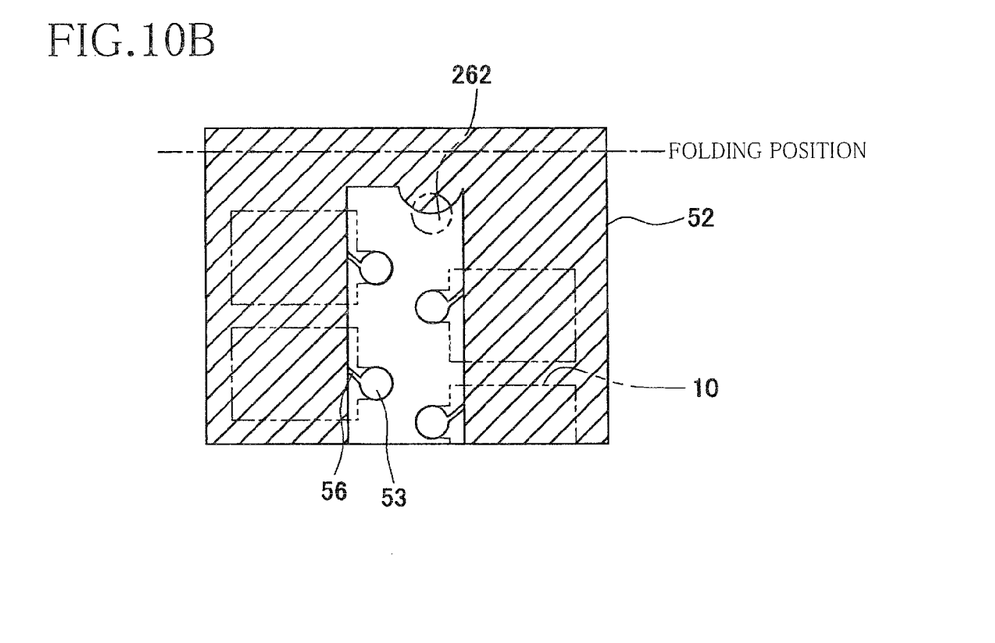

The reinforcement portion 162 in the first modified embodiment shown in FIG. 10A may be disposed away from the board-side contacts 53. According to a third modified embodiment shown in FIG. 10B, a reinforcement portion 262 is disposed so as to be shifted toward the right side in FIG. 10B and so as to be located more away from the closest board-side contact 53, as compared with the reinforcement portion 162 shown in FIG. 10A. In the third modified embodiment wherein the reinforcement portion 262 is disposed so as to be away from any of the board-side contacts 53 to the extent possible, it is possible to reduce a risk of occurrence of migration and short circuit.

In the illustrated embodiment and the modified embodiments, the principle of the invention is applied to the connection structure and the connection method between the piezoelectric actuator and the COF of the ink-jet head. The invention is applicable to not only the connection structure with respect to the piezoelectric actuator, but also to any kind of a connection structure and a connection method between a to-be-connected body and a wiring board, irrespective of usage, such as a connection structure and a connection method between a liquid crystal cell (LCC) of a liquid crystal display and a COF on which is mounted a driver IC for driving the LCC.

What is claimed is:

1. A connection structure for connecting a wiring board to a to-be-connected body having electric contacts, the wiring board including: a flexible base formed of electrically insulating resin and having board-side contacts which are provided on a facing surface of the flexible base that is to face the to-be-connected body; and a cover film which covers the facing surface of the flexible base except the board-side contacts and a non-covered partial region of the facing surface, wherein the connection structure comprises: conduction portions which are formed of electrically conductive resin including a metal material and thermosetting resin and each of which bonds a corresponding one of the electric contacts of the to-be-connected body and a corresponding one of the board-side contacts of the wiring board to each other so as to permit electrical conduction therebetween; and a reinforcement portion formed of the same electrically conductive resin as the conduction portions and disposed at a position which is different from positions of the conductive portions and at which the reinforcement portion extends across both of a surface of the cover film and a surface of the non-covered partial region of the flexible base, the reinforcement portion bonding the to-be-connected body and the wiring board to each other for reinforcing connection therebetween.

2. The connection structure according to claim 1, wherein the to-be-connected body is a piezoelectric actuator having a piezoelectric layer.

3. The connection structure according to claim 1,
wherein the wiring board is drawn in one direction from a region thereof to which the to-be-connected body is connected, and
wherein the reinforcement portion is disposed ahead of the board-side contacts in the one direction and has a shape that is elongate in a width direction of the wiring board orthogonal to the one direction.

4. The connection structure according to claim 1, wherein the reinforcement portion is composed of a bump group including a plurality of bumps disposed close to each other.

5. The connection structure according to claim 4,
wherein the wiring board is drawn in one direction from a region thereof to which the to-be-connected body is connected, and
wherein the plurality of bumps of the bump group are arranged in a width direction of the wiring board orthogonal to the one direction and are disposed ahead of the board-side contacts in the one direction.

6. The connection structure according to claim 1,
wherein the wiring board is drawn in one direction from a region thereof to which the to-be-connected body is connected, and
wherein the reinforcement portion is disposed at a position at which the reinforcement portion extends across both of the surface of the non-covered partial region of the flexible base and the surface of the cover film in this order in the one direction.

7. The connection structure according to claim 1, comprising a plurality of reinforcement portions each as the reinforcement portion.

8. The connection structure according to claim 7,
wherein the wiring board is drawn in one direction from a region thereof to which the to-be-connected body is connected, and
wherein the plurality of reinforcement portions are arranged in a width direction of the wiring board orthogonal to the one direction and are disposed ahead of the board-side contacts in the one direction.

9. A method of connecting, to a to-be-connected body having electric contacts, a wiring board including: (a) a flexible base formed of electrically insulating resin and having board-side contacts which are provided on a facing surface of the flexible base that is to face the to-be-connected body; and (b) a cover film which covers the facing surface of the flexible base except the board-side contacts and a non-covered partial region of the facing surface, the method comprising the steps of:
  a first application step of applying electrically conductive resin including a metal material and thermosetting resin to one of the respective board-side contacts of the wiring board; and the respective electric contacts of the to-be-connected body, for permitting electrical conduction therebetween,
  a second application step of applying the electrically conductive resin to one of: an area of the wiring board which extends across both of a surface of the cover film and a surface of the non-covered partial region of the flexible base; and an area of the to-be-connected body that is to face the area of the wiring board, for reinforcing connection between the to-be-connected body and the wiring board; and
  a bonding step of bonding the to-be-connected body and the wiring board by pressing, while heating, the to-be-connected body and the wiring board with the electric contacts of the to-be-connected body and the board-side contacts of the wiring board positioned relative to each other, after the first application step and the second application step.

* * * * *